US012389530B2

(12) United States Patent
Mikawa et al.

(10) Patent No.: US 12,389,530 B2
(45) Date of Patent: Aug. 12, 2025

(54) FILTER MODULE, FILTER ELEMENT, AND ELECTRONIC DEVICE

(71) Applicant: Murata Manufacturing Co., Ltd., Nagaokakyo (JP)

(72) Inventors: Kentaro Mikawa, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 319 days.

(21) Appl. No.: 18/109,308

(22) Filed: Feb. 14, 2023

(65) Prior Publication Data

US 2023/0199942 A1 Jun. 22, 2023

Related U.S. Application Data

(63) Continuation of application No. PCT/JP2021/030662, filed on Aug. 20, 2021.

(30) Foreign Application Priority Data

Sep. 2, 2020 (JP) ................. 2020-147515

(51) Int. Cl.
*H03H 7/09* (2006.01)
*H05K 1/02* (2006.01)
*H05K 1/18* (2006.01)

(52) U.S. Cl.
CPC ........... *H05K 1/0233* (2013.01); *H05K 1/181* (2013.01); *H05K 2201/1006* (2013.01)

(58) Field of Classification Search
CPC .. H03H 7/09; H03H 7/00; H03H 7/01; H03H 7/0115; H03H 7/0138; H03H 7/1775;
(Continued)

(56) References Cited

U.S. PATENT DOCUMENTS 11,381,213 B2 * 7/2022 Hirose ................... H01F 27/40
2006/0220772 A1 10/2006 Suzuki et al.
(Continued)

FOREIGN PATENT DOCUMENTS

JP 2006287335 A 10/2006
JP 2007215377 A 8/2007
(Continued)

OTHER PUBLICATIONS

International Search Report in PCT/JP2021/030662, mailed Nov. 2, 2021, 3 pages.
(Continued)

*Primary Examiner* — Hai L Nguyen
(74) *Attorney, Agent, or Firm* — Keating & Bennett, LLP (57) ABSTRACT

A filter module includes a circuit board on or in which a ground electrode is provided, and a low pass filter on the circuit board. The low pass filter includes first and second inductors, and a capacitor. The first and second inductors are cumulatively connected to each other. Relationships of $Lp+Lg-M \geq 0$ and $Lp-M<0$ are satisfied, where Lp denotes an inductance of a path between a connection portion between the first and second inductors and a ground terminal, Lg denotes an inductance of a path between the ground terminal and the ground electrode, and M denotes a mutual inductance between the first and second inductors.

10 Claims, 9 Drawing Sheets

(58) Field of Classification Search
CPC .. H03H 7/1791; H03H 27/2804; H03H 27/29; H04B 1/1009; H04B 1/1018; H04B 1/10; H04B 1/1036; H04B 1/1081; H04B 1/109; H05K 1/181; H05K 1/0233
USPC .................................................. 333/167, 185
See application file for complete search history.

(56) References Cited

U.S. PATENT DOCUMENTS

2013/0009726 A1  1/2013  Sasaki
2021/0021252 A1  1/2021  Hirose et al.

FOREIGN PATENT DOCUMENTS

JP    2013021449 A    1/2013
WO    2019229939 A1   12/2019

OTHER PUBLICATIONS

Written Opinion in PCT/JP2021/030662, mailed Nov. 2, 2021, 3 pages.

\* cited by examiner

Fig. 12B
Prior Art

FILTER MODULE, FILTER ELEMENT, AND ELECTRONIC DEVICE

CROSS REFERENCE TO RELATED APPLICATIONS

This application claims the benefit of priority to Japanese Patent Application No. 2020-147515 filed on Sep. 2, 2020 and is a Continuation application of PCT Application No. PCT/JP2021/030662 filed on Aug. 20, 2021. The entire contents of each application are hereby incorporated herein by reference.

BACKGROUND OF THE INVENTION

1. Field of the Invention

The present invention relates to a filter module in which a radio-frequency filter circuit is provided, a filter element included in the filter module, and an electronic device including the filter module.

2. Description of the Related Art

Japanese Unexamined Patent Application Publication No. 2013-21449 discloses a low pass filter including two coils and a plurality of capacitors that are formed within a multilayer body. The two coils are spiral coils having respective central axes extending in a stacking direction of a plurality of insulator layers.

In the low pass filter disclosed in Japanese Unexamined Patent Application Publication No. 2013-21449, there is a structural parasitic inductor between a connection portion of the two coils and a ground terminal.

Furthermore, the low pass filter disclosed in Japanese Unexamined Patent Application Publication No. 2013-21449 is mounted on a circuit board and is used. The ground terminal of the low pass filter is connected to a ground terminal of the circuit board, and there is a parasitic inductor between the ground terminal of the circuit board and a reference potential electrode (generally, a ground electrode extending over a large area) of the circuit board as well.

Figure 12A:
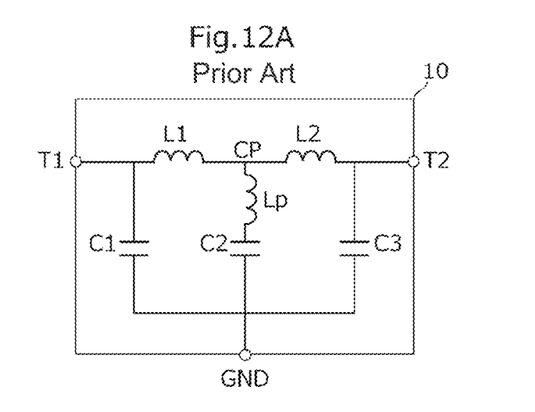
FIG. 12A is an equivalent circuit diagram of a low pass filter disclosed in Japanese Unexamined Patent Application Publication No. 2013-21449.
Figure 12B:
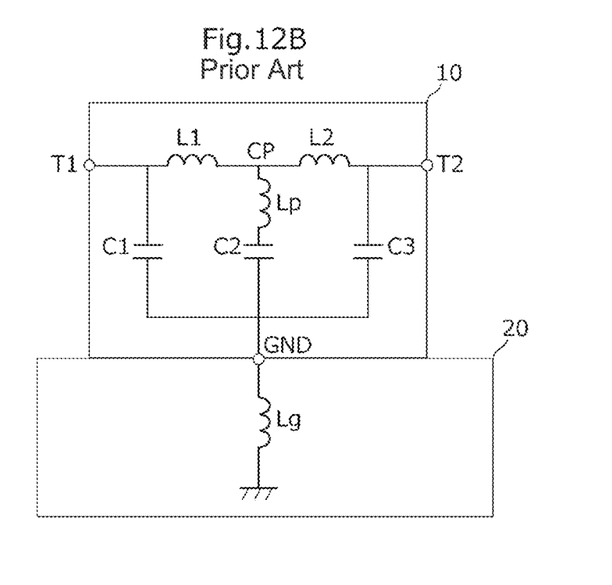
FIG. 12B is an equivalent circuit diagram of the low pass filter being mounted on a circuit board.

The above description is provided with reference to FIGS. 12A and 12B. FIG. 12A is an equivalent circuit diagram of the low pass filter disclosed in Japanese Unexamined Patent Application Publication No. 2013-21449, and FIG. 12B is an equivalent circuit diagram of the low pass filter being mounted on the circuit board.

In FIG. 12A, a low pass filter 10 includes a first terminal T1, a second terminal T2, and a ground terminal GND, and inductors L1 and L2 connected in series and capacitors C1, C2, and C3 connected in shunt with the ground constitute the low pass filter.

However, an inductance component, such as parasitic inductance, occurs between a connection portion CP between the inductors L1 and L2 and the ground terminal GND. An inductor Lp in FIG. 12A is an element specifying this inductance component. This inductance component Lp resonates with the capacitor C2 connected in series with the inductance component Lp. Thus, an attenuation pole occurs at a resonant frequency at which the resonance occurs, and attenuation decreases in a frequency band higher than the frequency of the attenuation pole, making it difficult to use the low pass filter in a case where attenuation is necessary over a wide frequency band on a higher frequency band side.

Furthermore, as illustrated in FIG. 12B, in a circuit board 20 where the low pass filter 10 is mounted, an inductance component, such as parasitic inductance, occurs between a reference potential electrode (a ground electrode extending over a large area) of the circuit board and a ground terminal connection pad to which the ground terminal GND of the low pass filter 10 is connected. An inductor Lg in FIG. 12B is an element specifying this inductance component. Thus, in practical usage, combined inductance of the inductance component Lp and the inductance component Lg resonates with capacitance of the capacitor C2, and an attenuation pole occurs at a resonant frequency at which the resonance occurs. Thus, attenuation decreases in a frequency band higher than the frequency of this attenuation pole.

Meanwhile, in a recent use, a frequency band tends to be broadened in which predetermined attenuation is provided in an attenuation range. For example, in a low pass filter that blocks a frequency band in a wide range of radio frequencies, such as 5G (5th Generation) or UWB (Ultra Wide Band), a frequency band in which attenuation is to be achieved covers a wide frequency band. Thus, it is desired that attenuation in an attenuation range of the low pass filter be provided over a wide frequency band.

SUMMARY OF THE INVENTION

Preferred embodiments of the present invention provide filter modules each having good attenuation characteristics over a wide frequency band on a higher frequency side than a pass band, filter elements included in the filter modules, and electronic devices including the filter modules or the filter elements.

A filter module according to a preferred embodiment of the present invention includes a circuit board in or on which a ground electrode is provided, and a filter element mounted on the circuit board. The filter element includes a first inductor and a second inductor connected in series between a first terminal and a second terminal and coupled to each other via a magnetic field, and a capacitor connected between a connection portion between the first inductor and the second inductor and a ground terminal. The first inductor and the second inductor are cumulatively connected to each other. Relationships of Lp+Lg−M≥0 and Lp−M<0 are satisfied, where M denotes mutual inductance that occurs between the connection portion and the ground terminal due to magnetic field coupling between the first inductor and the second inductor, Lp denotes inductance between the connection portion and the ground terminal, and Lg denotes inductance of a path between the ground terminal and the ground electrode.

In the above-described configuration, a combined inductance component that occurs between the connection portion between the first inductor and the second inductor and the ground electrode of the circuit board is reduced by negative mutual inductance that occurs in a path connected in shunt with the ground terminal due to magnetic field coupling between the first inductor and the second inductor, and a resonant frequency of the combined inductance and capacitance of the capacitor shifts to a range higher than a working frequency band. Furthermore, when the relationship of Lp+Lg−M≥0 is satisfied, an attenuation pole due to resonance between the combined inductance and the capacitance of the capacitor that are described above occurs.

A filter element according to a preferred embodiment of the present invention is mounted on a circuit board in or on which a ground electrode is provided. The filter element includes a ground terminal connected to the ground electrode, a first inductor and a second inductor connected in series between a first terminal and a second terminal and coupled to each other via a magnetic field, and a capacitor connected between a connection portion between the first inductor and the second inductor and the ground terminal. The first inductor and the second inductor are cumulatively connected to each other. A relationship of Lp−M<0 is satisfied, where M denotes mutual inductance that occurs between the connection portion and the ground terminal due to magnetic field coupling between the first inductor and the second inductor, and Lp denotes inductance between the connection portion and the ground terminal.

In the above-described configuration, a combined inductance component that occurs between the connection portion between the first inductor and the second inductor and the ground electrode of the circuit board is reduced by negative mutual inductance that occurs in a path connected in shunt with the ground terminal due to magnetic field coupling between the first inductor and the second inductor, and a resonant frequency of the combined inductance and capacitance of the capacitor shifts to a range higher than a working frequency band.

An electronic device according to a preferred embodiment of the present invention includes a filter module or a filter element according to a preferred embodiment of the present invention described above.

Preferred embodiments of the present invention provide filter modules having good attenuation characteristics over a wide frequency band on a higher frequency side than a pass band, filter elements each provided in a filter module according to a preferred embodiment of the present invention, and electronic devices each including a filter module according to a preferred embodiment of the present invention.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing examples of preferred embodiments of the present invention with reference to the drawings. In the drawings, the same or corresponding elements are denoted by the same reference numerals. In consideration of ease of description or understanding of main points, preferred embodiments of the present invention will be described separately for convenience of explanation. However, configurations described in different preferred embodiments can be partially replaced or combined. In second and subsequent preferred embodiments, a description of features and elements in common with a first preferred embodiment is omitted, and only aspects in which the second and subsequent preferred embodiments differ from the first preferred embodiment will be described. In particular, the same or similar advantageous effects achieved by the same or similar configurations are not repeatedly described in each preferred embodiment.

First Preferred Embodiment

Figure 1A:
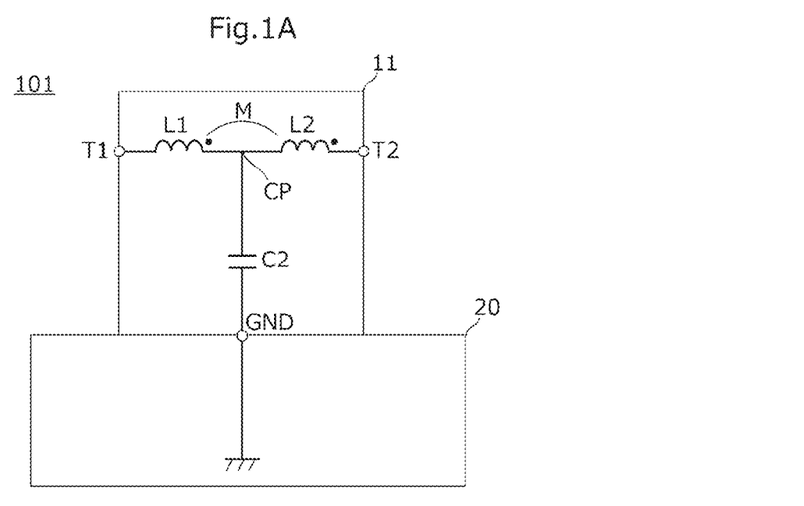
FIG. 1A is a circuit diagram of a filter module 101 according to a first preferred embodiment of the present invention.
Figure 1B:
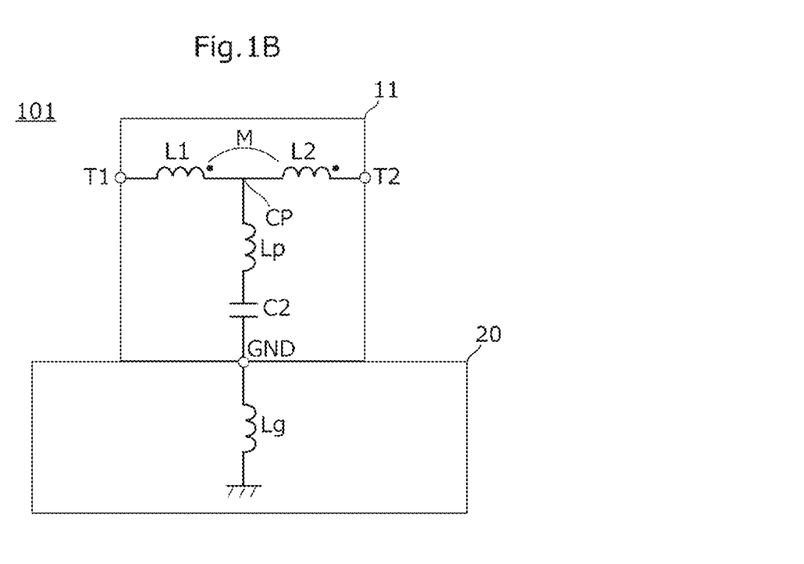
FIG. 1B is an equivalent circuit diagram of the filter module 101.

FIG. 1A is a circuit diagram of a filter module 101 according to a first preferred embodiment of the present invention. FIG. 1B is an equivalent circuit diagram of the filter module 101. The filter module 101 includes a low pass filter 11, and a circuit board 20 where a ground electrode is provided.

The low pass filter 11 illustrated in FIG. 1A includes a first terminal T1, a second terminal T2, and a ground terminal GND. The low pass filter 11 further includes a first inductor L1 and a second inductor L2 that are connected in series between the first terminal T1 and the second terminal T2 and are coupled to each other via a magnetic field, and a capacitor C2 connected between a connection portion CP between the first inductor L1 and the second inductor L2 and the ground terminal GND. Hereinafter, for the reference numeral of an inductor and the reference numeral of inductance of that inductor, a common reference numeral is used. Thus, for example, the inductance of the inductor L1 is denoted by L1.

An inductance component Lp, such as, for example, parasitic inductance, occurs between the connection portion CP between the first inductor L1 and the second inductor L2 and the ground terminal GND that are illustrated in FIG. 1A. In FIG. 1B, the inductance component is represented by an inductor Lp.

The ground electrode of the circuit board 20 is a reference potential electrode of the circuit board 20 and is generally an electrode extending over a large area. That is, "ground electrode" in the present description is a planar electrode defining and functioning as a reference potential in a circuit. As illustrated in FIG. 1B, an inductance component Lg, such as a parasitic inductance, occurs between the reference potential electrode of the circuit board 20 and a ground terminal connection pad to which the ground terminal GND of the low pass filter 11 is connected. In FIG. 1B, the inductance component is represented by an inductor Lg.

Figure 2:
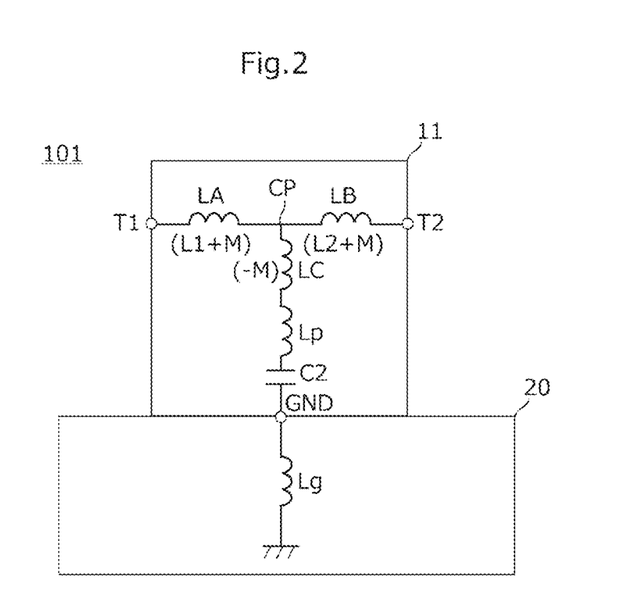
FIG. 2 is an equivalent circuit diagram in which mutual inductance that occurs due to magnetic field coupling between a first inductor L1 and a second inductor L2 is represented as a circuit element.

FIG. 2 is an equivalent circuit diagram in which mutual inductance that occurs due to magnetic field coupling between the first inductor L1 and the second inductor L2 is represented as a circuit element. As illustrated in FIG. 2, when a circuit connected between the first terminal T1 and the second terminal T2 is represented by a T-type equivalent circuit including inductors LA, LB, and LC, the inductor LC representing mutual inductance is connected in shunt between a connection point between the inductors LA and LB connected in series and the ground terminal GND. The first inductor L1 and the second inductor L2 are cumulatively connected to each other. Thus, the inductance of the inductor LA is (L1+M), the inductance of the inductor LB is (L2+M), and the inductance of the inductor LC is (−M).

In the above-described configuration, negative mutual inductance (−M) occurs in a path connected in shunt with the ground terminal GND due to magnetic field coupling between the first inductor L1 and the second inductor L2. Inductance components that occur between the connection portion CP between the first inductor L1 and the second inductor L2 and the ground electrode of the circuit board 20 are reduced by the negative mutual inductance (−M). Thus, a resonant frequency (attenuation pole frequency) of combined inductance of the negative mutual inductance (−M) and the inductance components Lp and Lg and capacitance of the capacitor C2 shifts to a range higher than a working frequency band.

Incidentally, in the low pass filter disclosed in Japanese Unexamined Patent Application Publication No. 2013-21449, the two coils are connected in a differential connection manner, and mutual inductance that occurs due to magnetic field coupling between the coils is therefore positive. Thus, combined inductance that occurs in a path connected in shunt with the ground terminal GND of the low pass filter further increases.

In FIG. 1B, relationships among the inductance component Lg that occurs between the ground electrode of the circuit board 20 and the ground terminal GND of the low pass filter 11, the inductance component Lp, and the mutual inductance (−M) are as follows.

$$Lp+Lg-M\geq 0$$

$$Lp-M<0$$

As a result, the inductance component Lg is reduced by negative inductance (Lp−M). Furthermore, when Lp+Lg−M≥0 is satisfied, an attenuation pole due to resonance between the combined inductance and the capacitance of the capacitor C2 that are described above occurs.

Figure 3A:
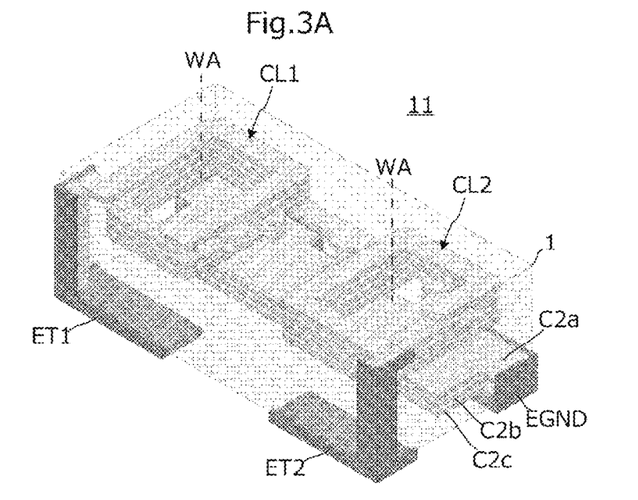
FIGS. 3A and 3B are perspective views of a low pass filter 11 according to a preferred embodiment of the present invention.
Figure 3B:
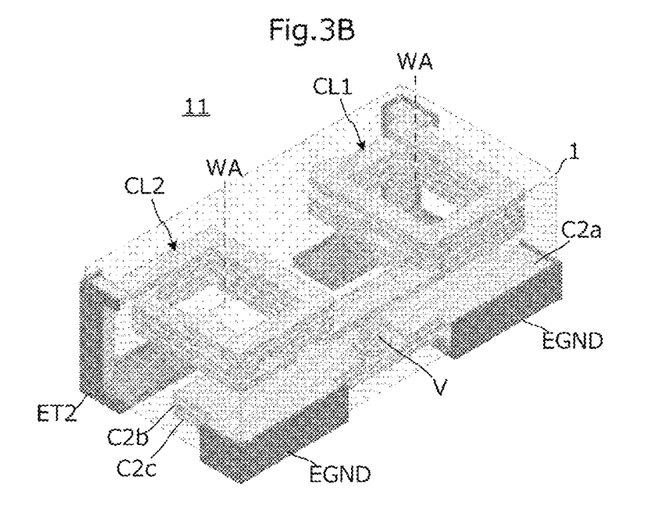

FIGS. 3A and 3B are perspective views of the low pass filter 11. FIGS. 3A and 3B are different in terms of points of view. Furthermore, both of FIGS. 3A and 3B illustrate the interior in perspective.

The low pass filter 11 includes a multilayer body 1 including a plurality of rectangular or substantially rectangular insulator layers that are laminated and having a rectangular or substantially rectangular parallelepiped shape. On an outer surface of this multilayer body 1, a first terminal electrode ET1, a second terminal electrode ET2, and two ground terminal electrodes EGND are provided.

The first inductor L1 includes a coil-shaped conductor CL1 provided in the multilayer body 1 including the plurality of insulator layers, and the second inductor L2 includes a coil-shaped conductor CL2 provided in the multilayer body 1 including the plurality of insulator layers.

The capacitor C2 includes capacitor electrodes C2a, C2b, and C2c, and insulator layers interposed between the capacitor electrodes C2a, C2b, and C2c, and the capacitor electrodes C2a, C2b, and C2c face the insulator layers in a stacking direction of the plurality of insulator layers.

A connection portion between the coil-shaped conductor CL1 of the first inductor L1 and the coil-shaped conductor CL2 of the second inductor L2 and the capacitor electrode C2b are connected via an interlayer connection conductor V.

One end of the coil-shaped conductor CL1 of the first inductor L1 is electrically connected to the first terminal electrode ET1, and one end of the coil-shaped conductor CL2 of the second inductor L2 is electrically connected to the second terminal electrode ET2. The capacitor electrodes C2a and C2c are electrically connected to the ground terminal electrodes EGND, and the capacitor electrode C2b is electrically connected to the connection portion between the coil-shaped conductor CL1 of the first inductor L1 and the coil-shaped conductor CL2 of the second inductor L2 via the interlayer connection conductor V.

Figure 4:
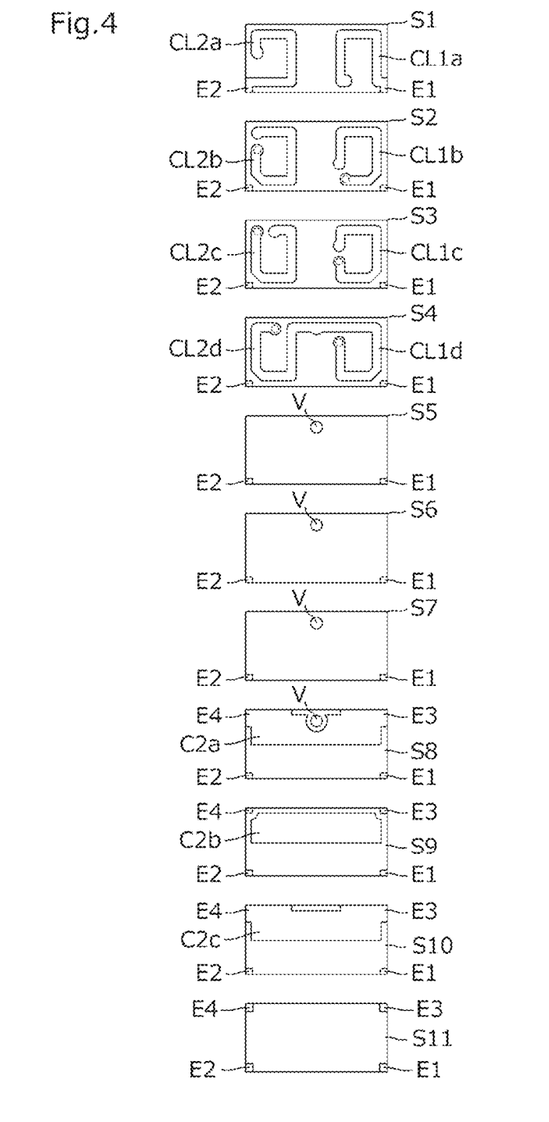
FIG. 4 is an exploded bottom view illustrating insulator layers of the low pass filter 11 and conductor patterns provided thereon.

FIG. 4 is an exploded bottom view illustrating the insulator layers of the low pass filter 11 and conductor patterns provided thereon.

The multilayer body 1 is formed by laminating insulator layers S1 to S11. FIG. 4 illustrates a bottom view of each insulator layer. The insulator layer S1 is an uppermost layer, and the insulator layer S11 is a lowermost layer. The insulator layers S2 to S11 are positioned between the insulator layer S1, which is the uppermost layer, and the insulator layer S11, which is the lowermost layer.

The coil-shaped conductor CL1 illustrated in FIGS. 3A and 3B includes coil-shaped conductors CL1a, CL1b, CL1c, and CL1d that are provided on the respective insulator layers S1 to S4. Similarly, the coil-shaped conductor CL2 includes coil-shaped conductors CL2a, CL2b, CL2c, and CL2d.

Furthermore, the capacitor C2 includes the capacitor electrodes C2a, C2b, and C2c that are provided on the respective insulator layers S8 to S11, and the insulator layers S9 and S11.

When viewed in directions of winding axes WA of the coil-shaped conductors CL1 and CL2 (see FIGS. 3A and 3B), the coil-shaped conductors CL1 and CL2 include at least a portion that does not overlap the capacitor electrodes C2a, C2b, and C2c. Thus, unwanted parasitic capacitance that occurs between the coil-shaped conductors CL1 and CL2 and the capacitor electrodes C2a, C2b, and C2c is reduced.

On the insulator layers S1 to S11, side terminal electrodes E1 and E2 are provided. Furthermore, on the insulator layers S8 to S11, side terminal electrodes E1, E2, E3, and E4 are provided. For the side terminal electrodes E1, E2, E3, and E4 that are provided on the insulator layers, terminal electrodes with the same reference numeral are electrically connected to each other.

One end of the coil-shaped conductor CL1a is electrically connected to the side terminal electrode E1, and one end of the coil-shaped conductor CL2a is electrically connected to the side terminal electrode E2. The capacitor electrode C2a and the capacitor electrode C2c are electrically connected to the side terminal electrodes E3 and E4.

When viewed in the directions of the winding axes WA of the coil-shaped conductors, the capacitor electrodes C2a, C2b, and C2c include a portion that does not overlap the first terminal electrode ET1 and the second terminal electrode ET2. Thus, unwanted parasitic capacitance that occurs between the capacitor electrodes C2a, C2b, and C2c, and the first terminal electrode ET1 and the second terminal electrode ET2 is reduced. When viewed in the directions of the winding axes WA of the coil-shaped conductors, the capacitor electrodes C2a, C2b, and C2c may include a portion that does not overlap the first terminal electrode ET1 or the second terminal electrode ET2. For example, in a case where the capacitor electrodes C2a, C2b, and C2c include a portion that does not overlap the first terminal electrode ET1, parasitic capacitance between the capacitor C2 and the first terminal T1 that are illustrated in FIG. 1A can be reduced. Similarly, in a case where the capacitor electrodes C2a, C2b, and C2c include a portion that does not overlap the second terminal electrode ET2, parasitic capacitance between the capacitor C2 and the second terminal T2 can be reduced.

The insulator layers S1 to S11 of the multilayer body 1 are formed through, for example, screen printing of a photosensitive insulating paste and a photosensitive conductive paste, and the exposure and development. These insulator layers S1 to S11 are laminated to form the multilayer body 1.

Specifically, a photosensitive insulating paste layer, for example, is screen-printed, irradiated with ultraviolet light, and developed with an alkaline solution. Thus, an insulating base material pattern including, for example, an opening for an outer electrode and/or a via hole is provided. Furthermore, a photosensitive conductive paste is, for example, screen-printed, irradiated with ultraviolet light, and developed with an alkaline solution to thus form a conductor pattern. The insulating base material pattern and the conductor pattern are laminated to obtain a mother multilayer body. Subsequently, the mother multilayer body is cut into chips to obtain many multilayer bodies 1. To improve solderability, conductivity, and resistance to environment, surfaces of outer electrodes are Ni/Au-plated, for example.

A method of forming the above-described multilayer body 1 is not limited to this. For example, a method may be used in which a conductor paste is printed through a screen printing plate including openings to achieve a conductor pattern shape and lamination is performed. Alternatively, conductor foil may be attached to an insulating base material and be subjected to patterning to thus form conductor patterns of respective insulator layers. A method of forming an outer electrode is also not limited to this. For example, an outer electrode may be formed on the underside and sides of the multilayer body 1 by dipping a laminated body in a conductor paste to or by a sputtering method, and the surface thereof may further be plated.

Figure 5:
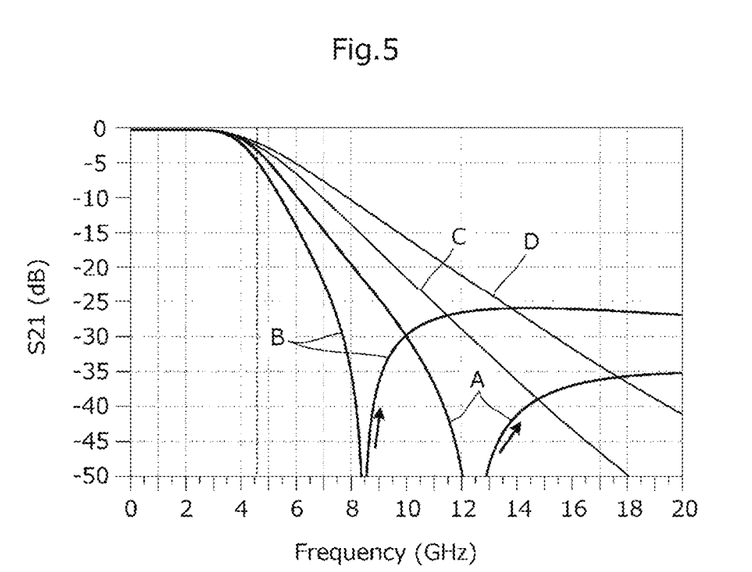
FIG. 5 illustrates a frequency response of a transmission coefficient of the filter module 101.

FIG. 5 illustrates a frequency response of a transmission coefficient of the filter module 101. In FIG. 5, the horizontal axis represents frequency, and the vertical axis represents transmission coefficient. In FIG. 5, a characteristic A is a characteristic of the low pass filter 11 according to the present preferred embodiment, and characteristics B, C, and D are characteristics of a filter module as a comparative example. The characteristic B is a characteristic exhibited when the mutual inductance M illustrated in FIGS. 1A and 1B is 0.

When the characteristic A of the filter module 101 according to the present preferred embodiment is compared with the characteristic B of the filter module as the comparative example, pass frequency bands of both the characteristics A and B are in a 2.4 GHz band used for a wireless LAN, and cutoff frequencies at which insertion loss reaches about −3 dB are about 4.5 GHz. An attenuation pole frequency of the characteristic B of the filter module as the comparative example is, for example, about 8.5 GHz, whereas an attenuation pole frequency of the filter module 101 according to this preferred embodiment is, for example, about 12.5 GHz.

As represented by arrow signs in FIG. 5, when a frequency difference between the cutoff frequency and an attenuation pole frequency is small, a jump in attenuation from the attenuation pole frequency to a higher frequency range is steep and large (attenuation is shallower). When a frequency difference between the cutoff frequency and an attenuation pole frequency is large, a jump in attenuation from the attenuation pole frequency to a higher frequency range is moderate and small (attenuation is deeper). Thus, the filter module 101 according to the present preferred embodiment is larger in attenuation in a frequency range higher than the frequency of the attenuation pole than the filter module as the comparative example representing the characteristic B. This is because the inductance component Lp that occurs between the connection portion CP between the first inductor L1 and the second inductor L2 and the ground terminal GND, and the inductance component Lg in the circuit board are reduced by the negative mutual inductance (−M).

In FIG. 5, the characteristic C is a characteristic exhibited when combined inductance (Lp+Lg−M) of the inductance component Lp and the inductance component Lg that occur between the connection portion CP between the first inductor L1 and the second inductor L2 and the ground electrode, and the mutual inductance (−M) is 0. The characteristic D is a characteristic exhibited when the combined inductance (Lp+Lg−M) is negative. As described, when the combined inductance of the inductance component Lp, the inductance component Lg, and the mutual inductance (−M) is 0 or negative, resonance with the capacitor C2 does not occur, and thus an attenuation pole does not occur. For this reason, predetermined attenuation is not able to be provided in a frequency range higher than the cutoff frequency. Furthermore, when the combined inductance of the inductance component Lp, the inductance component Lg, and the mutual inductance (−M) is negative, steepness deteriorates significantly, making it more difficult to obtain a high degree of attenuation over a wide frequency band. Thus, it is preferable that the combined inductance (Lp+Lg−M) is positive.

Second Preferred Embodiment

In a second preferred embodiment of the present invention, a filter module including the low pass filter, and the circuit board where the low pass filter is mounted will be exemplified.

Figure 6:
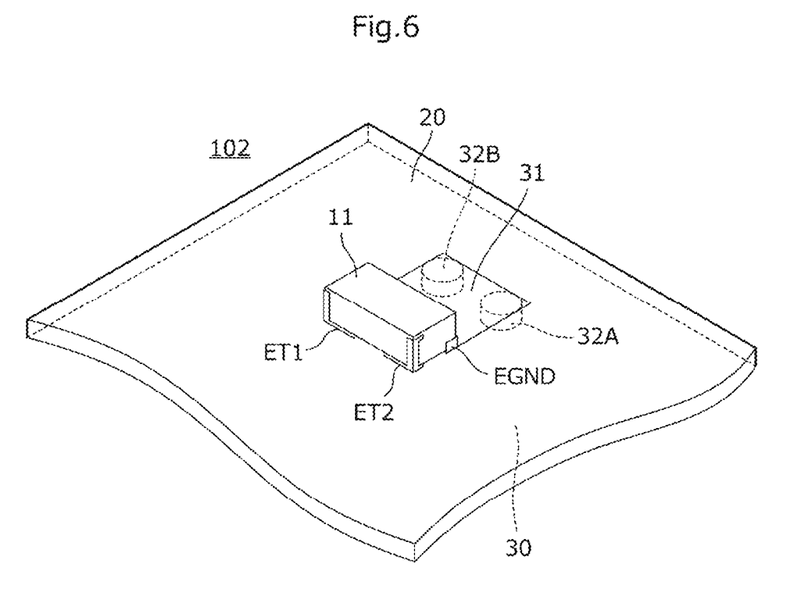
FIG. 6 is a perspective view of a filter module 102 according to a second preferred embodiment of the present invention.
Figure 7:
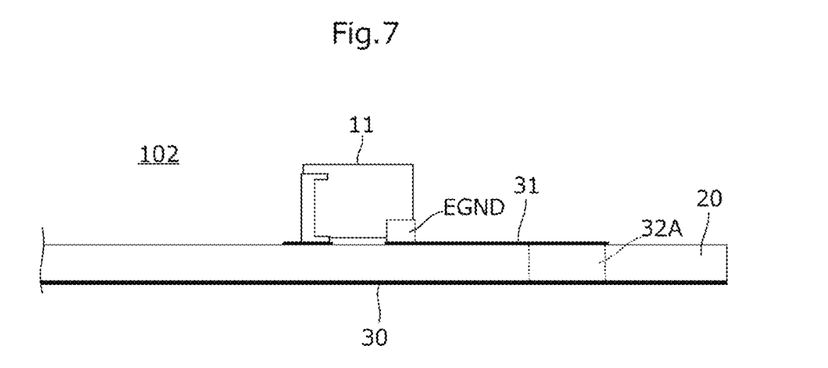
FIG. 7 is a front view of the filter module 102.

FIG. 6 is a perspective view of a filter module 102 according to the second preferred embodiment. FIG. 7 is a front view of the filter module 102. On a top surface of the circuit board 20, a pad to connect each terminal of the low pass filter 11 is provided. Furthermore, a wiring electrode 31 that is continuous from a pad where the ground terminal electrodes EGND of the low pass filter 11 are connected is provided. On a bottom surface of the circuit board 20, a ground electrode 30 is provided. The ground electrode 30 is a reference potential electrode of the circuit board 20 and extends over a large area. In the present preferred embodiment, the area of the ground electrode 30 is larger than the square of the long side of a rectangle presented when the low pass filter 11 is viewed in plan. Within the circuit board 20, interlayer connection conductors 32A and 32B that connect the wiring electrode 31 on the top surface and the ground electrode 30 on the bottom surface are provided. Thus, the ground terminal electrodes EGND of the low pass filter 11 are electrically connected to the ground electrode 30 of the circuit board 20 via a path of [wiring electrode 31]-[interlayer connection conductors 32A and 32B]-[ground electrode 30].

An inductance component of the wiring electrode 31 and inductance components of the interlayer connection conductors 32A and 32B correspond to the inductance component Lg illustrated in FIG. 2.

Figure 8:
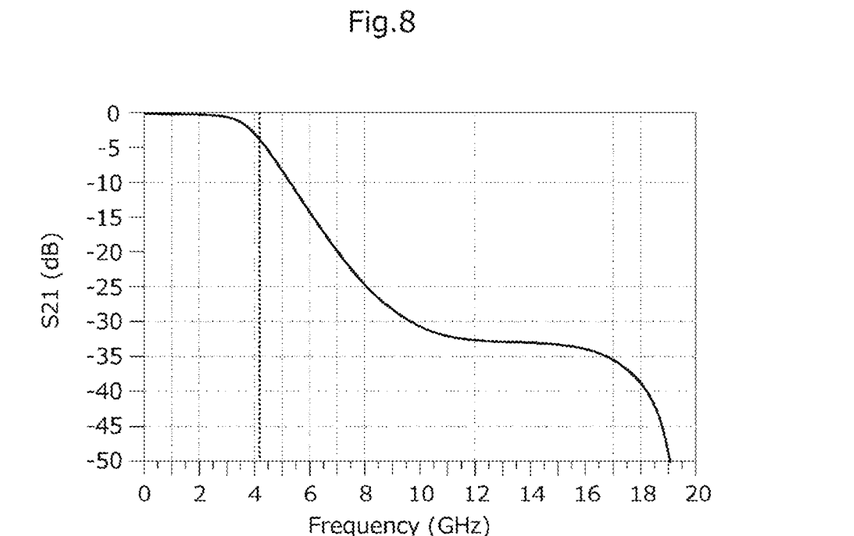
FIG. 8 illustrates a frequency response of a transmission coefficient of the filter module 102.

FIG. 8 illustrates a frequency response of a transmission coefficient of the filter module 102. In FIG. 8, the horizontal axis represents frequency, and the vertical axis represents transmission coefficient. In this example, a pass frequency band is a 2.4 GHz band used for a wireless LAN, a cutoff frequency at which insertion loss reaches about −3 dB is about 4 GHz, and an attenuation pole frequency of a lowest attenuation pole is greater than or equal to about 19 GHz. Thus, when the attenuation pole frequency shifts to a range higher than a working frequency band, an attenuation range of the filter module 102 can be broadened.

Third Preferred Embodiment

In a third preferred embodiment of the present invention, a filter module will be described in which a circuit connected between a connection point between the first inductor L1 and the second inductor L2 and the ground differs from the example described above.

Figure 9A:
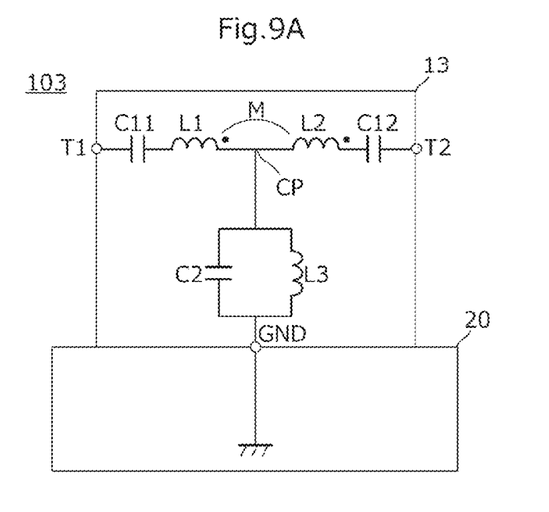
FIG. 9A is a circuit diagram of a filter module 103 according to a third preferred embodiment of the present invention.
Figure 9B:
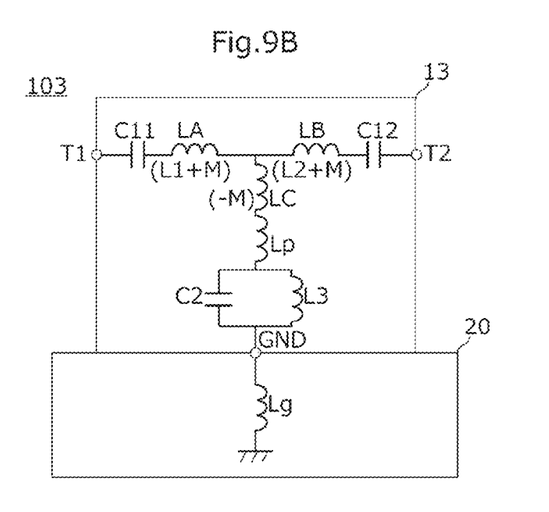
FIG. 9B is an equivalent circuit diagram of the filter module 103.

FIG. 9A is a circuit diagram of a filter module 103 according to the third preferred embodiment. FIG. 9B is an equivalent circuit diagram of the filter module 103. The filter module 103 includes the circuit board 20 where the ground electrode is provided, and a band pass filter 13.

The band pass filter 13 includes the first terminal T1, the second terminal T2, and the ground terminal GND. Furthermore, the band pass filter 13 includes the first inductor L1, the second inductor L2, and capacitors C11 and C12 that are connected in series between the first terminal T1 and the second terminal T2, and includes a parallel circuit including the capacitor C2 and a third inductor L3 and being connected between the connection portion CP between the first inductor L1 and the second inductor L2 and the ground terminal GND.

For the band pass filter 13, a band pass filter characteristic is represented by a circuit including the first inductor L1, the second inductor L2, and the capacitors C11 and C12 and being connected in series between the first terminal T1 and the second terminal T2, and by the parallel circuit including the third inductor L3 and the capacitor C2 and being connected between the connection point between the first inductor L1 and the second inductor L2 and the ground.

An inductance component, such as, for example, parasitic inductance, occurs between the connection portion CP between the first inductor L1 and the second inductor L2 and the ground terminal GND that are illustrated in FIG. 9A. In FIG. 9B, the inductance component is represented by an inductor Lp.

As illustrated in FIG. 9B, when a circuit including the first inductor L1 and the second inductor L2 is represented by a T-type equivalent circuit including inductors LA, LB, and LC, the inductor LC representing mutual inductance is connected between a connection point between the inductors LA and LB connected in series and the ground terminal GND. The first inductor L1 and the second inductor L2 are cumulatively connected to each other. Thus, inductance of the inductor LA is (L1+M), inductance of the inductor LB is (L2+M), and inductance of the inductor LC is (−M).

The ground electrode of the circuit board 20 is a reference potential electrode of the circuit board 20 and is an electrode extending over a large area. As illustrated in FIG. 9B, an inductance component Lg, such as, for example, parasitic inductance, occurs between the reference potential electrode of the circuit board 20 and a ground terminal connection pad to which the ground terminal GND of the band pass filter 13 is connected.

In FIG. 9B, combined inductance of the inductance component Lg that occurs between the ground electrode of the circuit board 20 and the ground terminal GND of the band pass filter 13, the inductance component Lp, and the mutual inductance (−M) is larger than or equal to 0. That is, (Lp+Lg−M)≥0 is satisfied, where Lg denotes inductance of the inductance component Lg and Lp denotes inductance of the inductance component Lp.

In the above-described configuration, inductance components that occur between the connection portion CP between the first inductor L1 and the second inductor L2 and the ground electrode of the circuit board 20 are reduced by negative mutual inductance (−M) that occurs in a path connected in shunt with the ground terminal GND due to magnetic field coupling between the first inductor L1 and the second inductor L2. Thus, in a range higher than a parallel resonant frequency of the third inductor L3 and the capacitor C2, the inductance of the above-described path connected in shunt is reduced, and attenuation in a range higher than a pass band increases.

Figure 10:
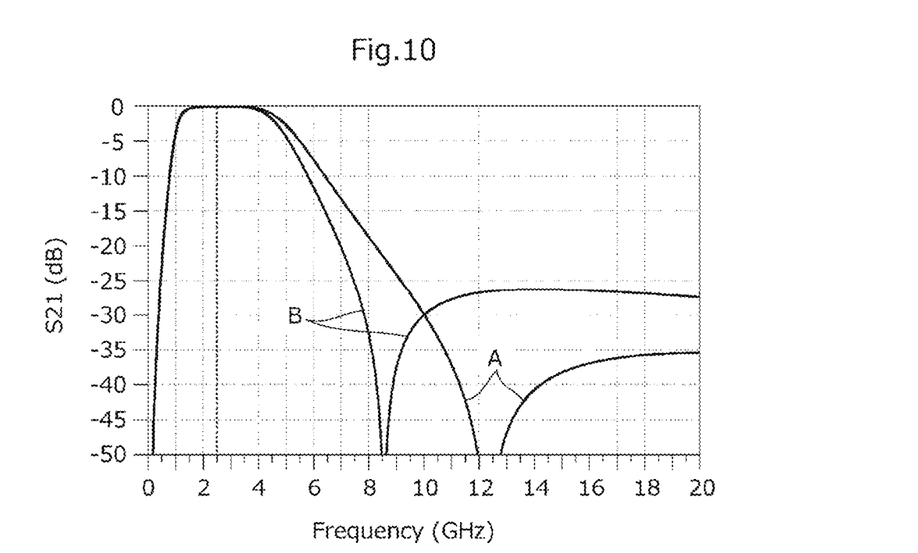
FIG. 10 illustrates a frequency response of a transmission coefficient of a band pass filter 13.

FIG. 10 illustrates a frequency response of a transmission coefficient of the band pass filter 13. In FIG. 10, the horizontal axis represents frequency, and the vertical axis represents transmission coefficient. In FIG. 10, a characteristic A is a characteristic of the band pass filter 13 according to the present preferred embodiment, and a characteristic B is a characteristic of a band pass filter as a comparative example. The characteristic B is a characteristic exhibited when the mutual inductance M illustrated in FIG. 9B is 0.

When the characteristic A of the band pass filter 13 according to the present preferred embodiment is compared with the characteristic B of the band pass filter as the comparative example, center frequencies of pass bands of both the characteristics A and B are about 2.4 GHz. An attenuation pole frequency of the characteristic B of the band pass filter as the comparative example is about 8.5 GHz, whereas an attenuation pole frequency of the band pass filter 13 according to this preferred embodiment is about 12.5 GHz.

The band pass filter 13 according to the present preferred embodiment is larger in attenuation in a frequency range higher than the frequency of the attenuation pole than the band pass filter as the comparative example representing the characteristic B. This is because the inductance component Lp that occurs between the connection portion CP between the first inductor L1 and the second inductor L2 and the ground terminal GND is reduced by the negative mutual inductance (−M).

Fourth Preferred Embodiment

In a fourth preferred embodiment of the present invention, an electronic device including the above-described filter module or filter element will be exemplified.

Figure 11:
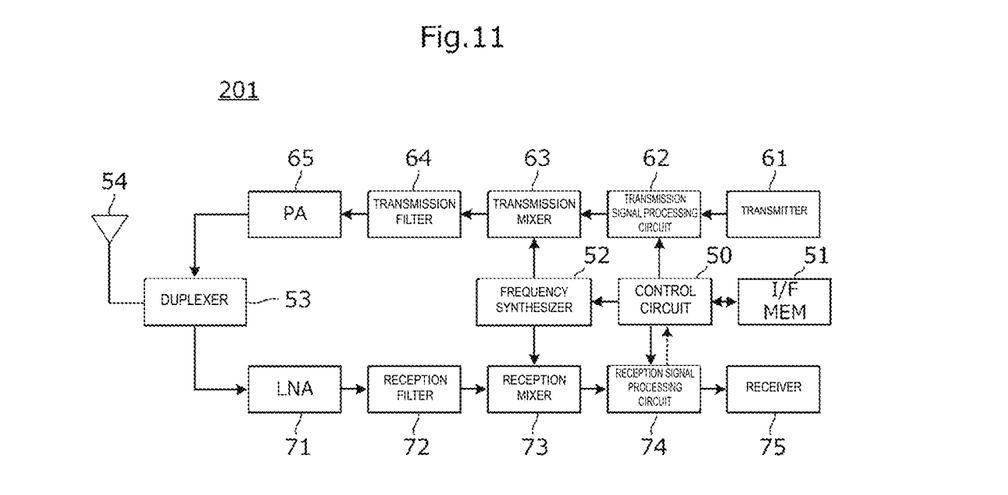
FIG. 11 is a block diagram illustrating a configuration of an electronic device 201 according to a fourth preferred embodiment of the present invention.

FIG. 11 is a block diagram illustrating a configuration of an electronic device 201 according to the fourth preferred embodiment. The electronic device 201 is, for example, a smartphone or mobile phone. The electronic device 201 includes a duplexer 53, an antenna 54, a control circuit 50, an interface and a memory 51, and a frequency synthesizer 52. A transmission system includes a transmitter 61, a transmission signal processing circuit 62, a transmission mixer 63, a transmission filter 64, and a power amplifier 65. A reception system includes a low noise amplifier 71, a reception filter 72, a reception mixer 73, a reception signal processing circuit 74, and a receiver 75. A transmission signal output from the power amplifier 65 is output to the antenna 54 via the duplexer 53. Furthermore, a signal received by the antenna 54 passes through the duplexer 53 and is amplified by the low noise amplifier 71. For example, for a case not of a call but of a data communication, the control circuit 50 processes a reception signal.

As the transmission filter 64 or a reception filter 72, a filter module or filter element according to a preferred embodiment of the present invention can be used. Furthermore, as a low-frequency filter of the duplexer 53, a filter module or a filter element according to a preferred embodiment of the present invention can be used.

Furthermore, in cases where filters are provided, for example, both before and after the power amplifier 65, both before and after the low noise amplifier 71, both before and after the transmission mixer 63, and both before and after the reception mixer 73, filter modules or filter elements according to preferred embodiments of the present invention can be used as those filters.

Furthermore, current smartphones or mobile phones are use a plurality of antennas and a plurality of frequency bands, and thus a band pass filter and a diplexer are frequently used. As the band pass filter and the diplexer, a combination of a filter module or a filter element according to a preferred embodiment of the present invention having low pass filter characteristics and a high pass filter can be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter module comprising:
a circuit board in or on which a ground electrode is provided; and
a filter element on the circuit board; wherein
the filter element includes:
a first inductor and a second inductor connected in series between a first terminal and a second terminal and coupled to each other via a magnetic field; and
a capacitor connected between a connection portion between the first inductor and the second inductor and a ground terminal;
the first inductor and the second inductor are cumulatively connected to each other; and
relationships of $Lp+Lg-M \geq 0$ and $Lp-M<0$ are satisfied, where M denotes a mutual inductance occurring between the connection portion and the ground terminal due to magnetic field coupling between the first inductor and the second inductor, Lp denotes an inductance between the connection portion and the ground terminal, and Lg denotes an inductance of a path between the ground terminal and the ground electrode.

2. The filter module according to claim 1, wherein a relationship among the inductance Lp, the inductance Lg, and the mutual inductance M is $Lp+Lg-M>0$.

3. The filter module according to claim 1, further comprising a third inductor connected in parallel with the capacitor.

4. The filter module according to claim 1, wherein
the first inductor and the second inductor each include a coil-shaped conductor in a multilayer body including a plurality of insulator layers;
the capacitor includes a capacitor electrode and an insulator layer of the plurality of insulator layers that face each other in a stacking direction of the plurality of insulator layers; and
when viewed in a direction of a winding axis of the coil-shaped conductor, the coil-shaped conductor includes at least a portion that does not overlap the capacitor electrode.

5. The filter module according to claim 4, wherein
the first terminal includes a first terminal electrode on the multilayer body, and the second terminal includes a second terminal electrode on the multilayer body; and
when viewed in the direction of the winding axis of the coil-shaped conductor, the capacitor electrode includes a portion that does not overlap at least the first terminal electrode or the second terminal electrode.

6. An electronic device comprising:
the filter module according to claim 1.

7. The electronic device according to claim 6, wherein a relationship among the inductance Lp, the inductance Lg, and the mutual inductance M is $Lp+Lg-M>0$.

8. The electronic device according to claim 6, further comprising a third inductor connected in parallel with the capacitor.

9. The electronic device according to claim 6, wherein
the first inductor and the second inductor each include a coil-shaped conductor in a multilayer body including a plurality of insulator layers;
the capacitor includes a capacitor electrode and an insulator layer of the plurality of insulator layers that face each other in a stacking direction of the plurality of insulator layers; and
when viewed in a direction of a winding axis of the coil-shaped conductor, the coil-shaped conductor includes at least a portion that does not overlap the capacitor electrode.

10. The electronic device according to claim 9, wherein
the first terminal includes a first terminal electrode on the multilayer body, and the second terminal includes a second terminal electrode on the multilayer body; and
when viewed in the direction of the winding axis of the coil-shaped conductor, the capacitor electrode includes a portion that does not overlap at least the first terminal electrode or the second terminal electrode.

* * * * *